United States Patent
Zhu et al.

(10) Patent No.: US 12,184,024 B2
(45) Date of Patent: Dec. 31, 2024

(54) COAXIAL ELECTRICAL CONNECTOR ADAPTER AND ELECTRICAL CONNECTOR TEST SYSTEM

(71) Applicant: Tyco Electronics (Shanghai) Co. Ltd., Shanghai (CN)

(72) Inventors: Liyun Zhu, Shanghai (CN); Zhigang Song, Shanghai (CN); Peng Zhai, Shanghai (CN); Yunhe Wang, Shanghai (CN)

(73) Assignee: Tyco Electronics (Shanghai) Co., Ltd., Shanghai (CN)

( * ) Notice: Subject to any disclaimer, the term of this patent is extended or adjusted under 35 U.S.C. 154(b) by 0 days.

(21) Appl. No.: 16/986,969

(22) Filed: Aug. 6, 2020

(65) Prior Publication Data
US 2021/0050680 A1 Feb. 18, 2021

(30) Foreign Application Priority Data
Aug. 14, 2019 (CN) .......................... 201910748830.5

(51) Int. Cl.
| | |
|---|---|
| H01R 9/05 | (2006.01) |
| G01R 31/66 | (2020.01) |
| H01R 11/01 | (2006.01) |
| H01R 24/54 | (2011.01) |
| H01R 31/06 | (2006.01) |
| H01R 24/38 | (2011.01) |
| H01R 27/02 | (2006.01) |
| H02J 7/00 | (2006.01) |

(52) U.S. Cl.
CPC .............. *H01R 9/05* (2013.01); *G01R 31/66* (2020.01); *H01R 11/01* (2013.01); *H01R 24/542* (2013.01); *H01R 31/06* (2013.01); *H01R 9/0503* (2013.01); *H01R 24/38* (2013.01); *H01R 24/54* (2013.01); *H01R 27/02* (2013.01); *H01R 2201/20* (2013.01); *H02J 7/0042* (2013.01)

(58) Field of Classification Search
CPC ........ H01R 9/05; H01R 11/01; H01R 24/542; H01R 31/06; H01R 24/54; H01R 9/0503; H01R 2201/20; H01R 24/38; H01R 27/02; G01R 31/66; H02J 7/0042
USPC ................................ 439/638, 700, 578–585
See application file for complete search history.

(56) References Cited

U.S. PATENT DOCUMENTS 5,062,808 A * 11/1991 Hosler, Sr. ........... H01R 24/542
439/580
7,416,418 B2 * 8/2008 Berthet .................. H01R 12/91
439/63

(Continued)

FOREIGN PATENT DOCUMENTS

| KR | 20110008481 U | * | 8/2011 | |
| WO | WO-2016136496 A1 | * | 9/2016 | ............. H01R 11/01 |

*Primary Examiner* — Justin M Kratt
(74) *Attorney, Agent, or Firm* — Barley Snyder

(57) ABSTRACT

A connector adapter includes a first sub-adapter directly and electrically connected with a first end of a connector and a second sub-adapter directly and electrically connected with a second end of the connector. The first end of the connector is electrically connected to a first cable through the first sub-adapter and to a test equipment through the first cable. The second end of the connector is electrically connected to a second cable through the second sub-adapter and to the test equipment through the second cable.

20 Claims, 6 Drawing Sheets

(56) References Cited

U.S. PATENT DOCUMENTS

2004/0229512 A1* 11/2004 Chen ................... H01R 9/05
                 439/638
2015/0263463 A1* 9/2015 Holland ............... H01R 24/46
                 439/578

* cited by examiner

COAXIAL ELECTRICAL CONNECTOR ADAPTER AND ELECTRICAL CONNECTOR TEST SYSTEM

CROSS-REFERENCE TO RELATED APPLICATION

This application claims the benefit of the filing date under 35 U.S.C. § 119(a)-(d) of Chinese Patent Application No. 201910748830.5, filed on Aug. 14, 2019.

FIELD OF THE INVENTION

The present invention relates to an electrical connector and, more particularly, to a connector adaptor for an electrical connector.

BACKGROUND

A coaxial RF (radio frequency) connector generally comprises an external conductor, a central conductor disposed inside the external conductor, and an insulator disposed between the external conductor and the central conductor. During designing the coaxial RF connector, it is necessary to test the performance of the designed coaxial RF connector. The end of the coaxial RF connector is only suitable for electrical connection with a circuit board or a special electronic component, and cannot be directly connected with a coaxial RF cable. Therefore, in the prior art, in order to connect the coaxial RF connector to a test equipment, both ends of the coaxial RF connector need to be welded to the circuit boards respectively, and each circuit board is provided with a cable connector which is used to be electrically connected to the test equipment through the coaxial RF cable. In this way, the coaxial RF connector is electrically connected to the test equipment through the circuit board, the cable connector, and the coaxial RF cable in this order.

However, it is difficult to completely remove the impact of the circuit board on each test project, resulting in inaccurate test results and test data. In addition, the coaxial RF connector cannot be removed from the circuit board and the coaxial RF connector cannot be reused, increasing costs.

SUMMARY

A connector adapter includes a first sub-adapter directly and electrically connected with a first end of a connector and a second sub-adapter directly and electrically connected with a second end of the connector. The first end of the connector is electrically connected to a first cable through the first sub-adapter and to a test equipment through the first cable. The second end of the connector is electrically connected to a second cable through the second sub-adapter and to the test equipment through the second cable.

BRIEF DESCRIPTION OF THE DRAWINGS

The above and other features of the present disclosure will become more apparent by describing in detail exemplary embodiments thereof with reference to the accompanying drawings, in which.

DETAILED DESCRIPTION OF THE EMBODIMENT(S)

Figure 1:
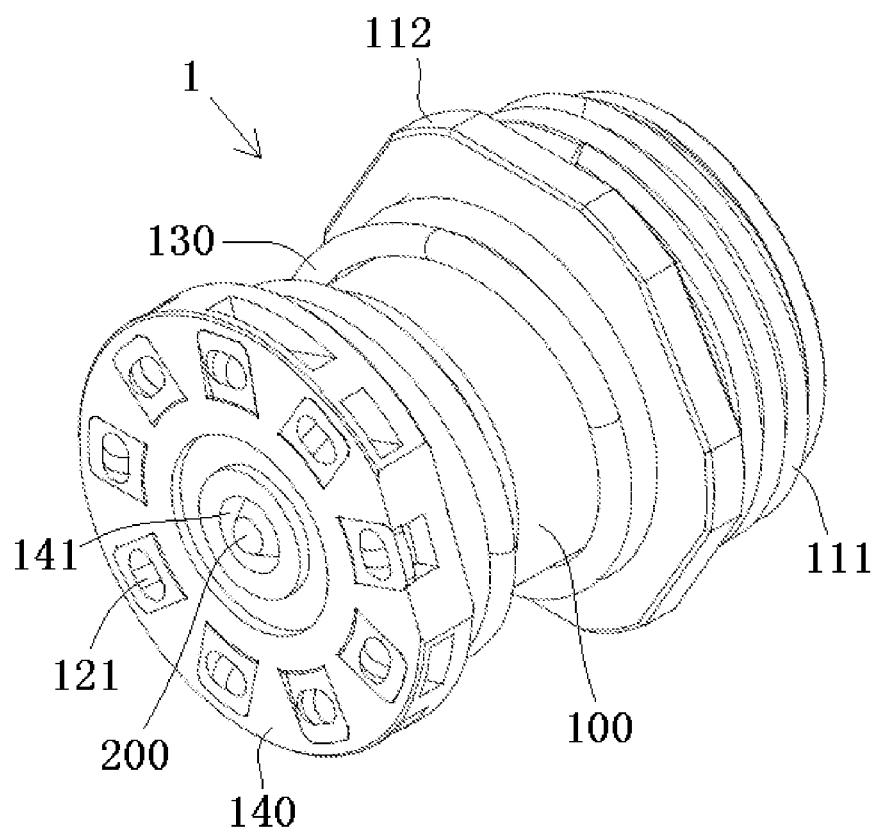
FIG. 1 is a perspective view of a connector according to an embodiment.

Exemplary embodiments of the present disclosure will be described hereinafter in detail with reference to the attached drawings, wherein like reference numerals refer to like elements. The present disclosure may, however, be embodied in many different forms and should not be construed as being limited to the embodiments set forth herein; rather, these embodiments are provided so that the present disclosure will convey the concept of the disclosure to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
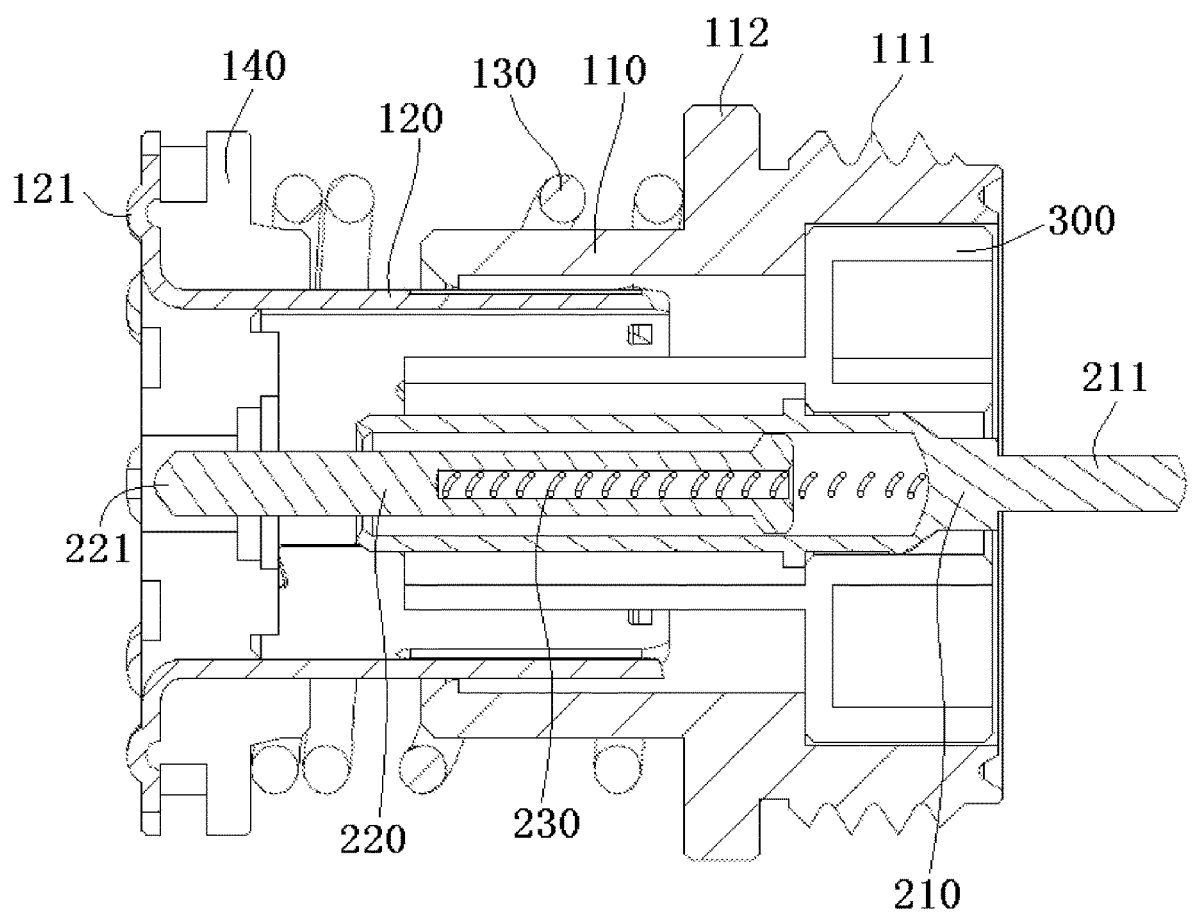
FIG. 2 is a sectional side view of the connector of FIG. 1.
Figure 3:
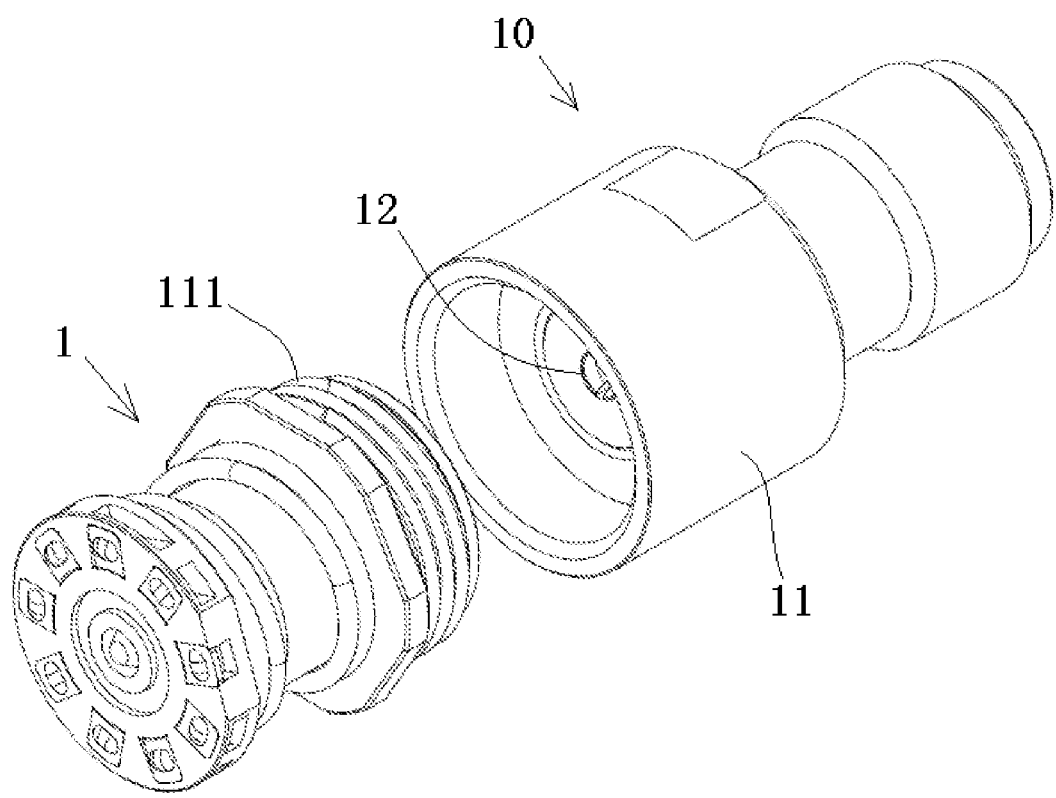
FIG. 3 is a perspective view of the connector and a first sub-adapter according to an embodiment.
Figure 4:
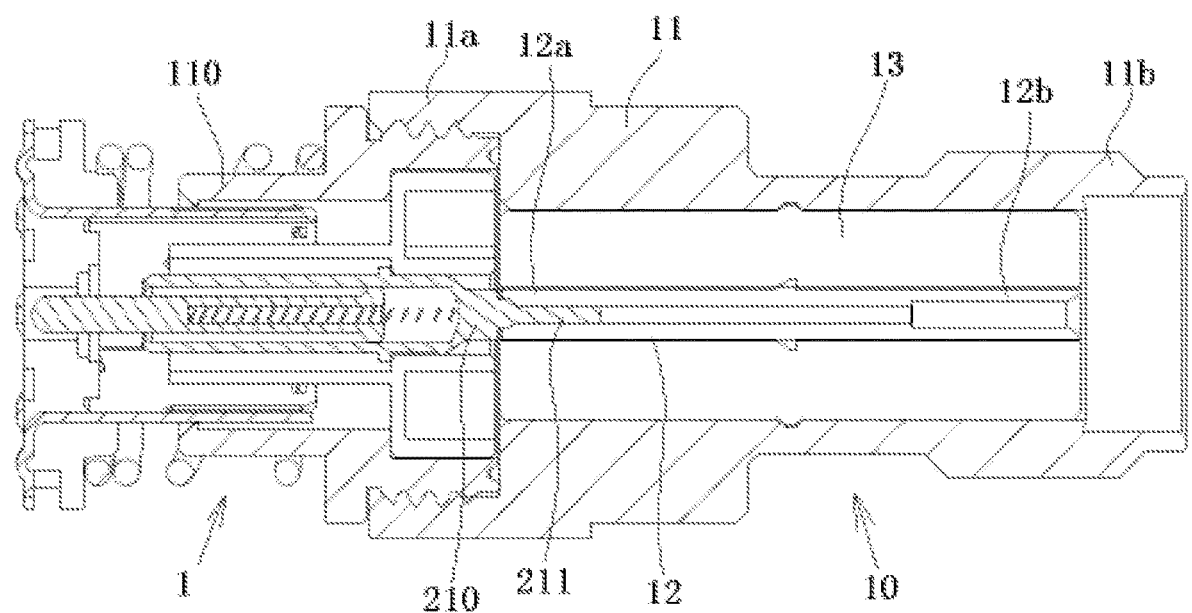
FIG. 4 is a sectional side view of the connector and the first sub-adapter of FIG. 3.
Figure 5:
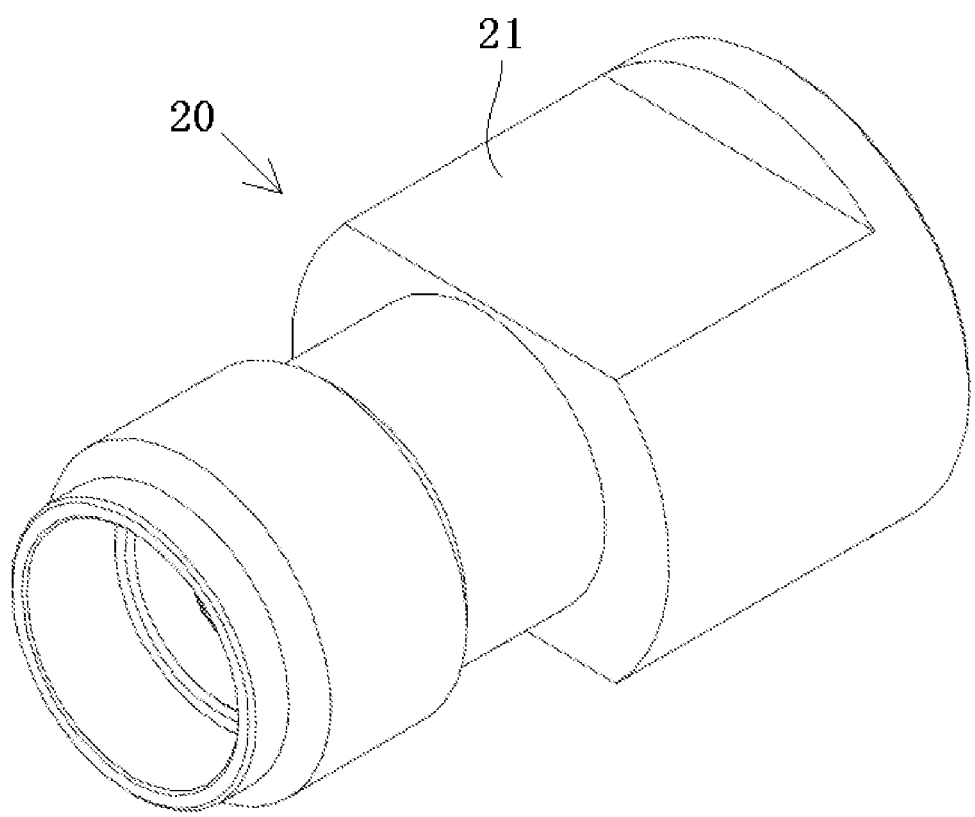
FIG. 5 is a perspective view of a second sub-adapter according to an embodiment.
Figure 6:
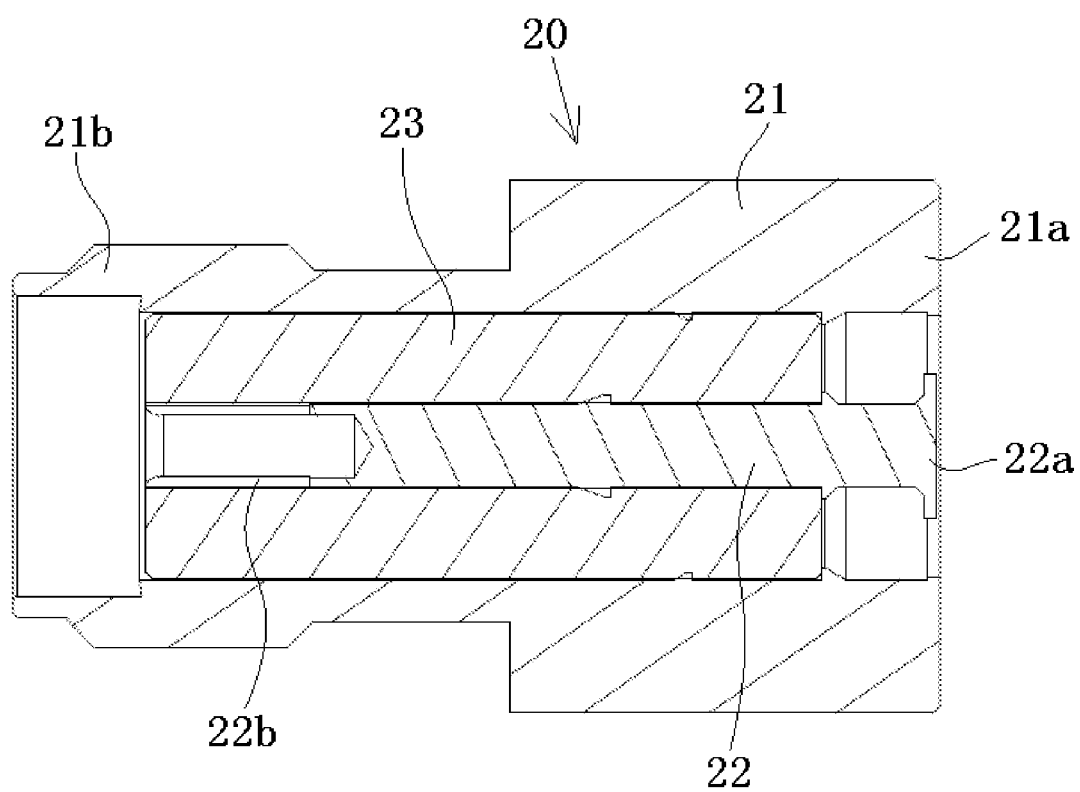
FIG. 6 is a sectional side view of the second sub-adapter of FIG. 5.

A connector adapter according to an embodiment includes a first sub-adapter 10, shown in FIGS. 3 and 4, and a second sub-adapter 20, shown in FIGS. 5 and 6. Each of the first sub-adapter 10 and the second sub-adapter 20 is usable with a connector 1 shown in FIGS. 1-4.

The first sub-adapter 10 is adapted to be directly and electrically connected with a first end (right end in FIG. 1) of the connector 1, so that the first end of the connector 1 may be electrically connected to a first cable (not shown) through the first sub-adapter 10 and then may be electrically connected to a test equipment (not shown) through the first cable. The second sub-adapter 20 is adapted to be directly and electrically connected with a second end of the connector 1, so that the second end of the connector 1 may be electrically connected to a second cable (not shown) through the second sub-adapter 20 and thereby may be electrically connected to the test equipment through the second cable. In an embodiment, the connector 1 is a coaxial RF connector, and the first cable and the second cable are coaxial RF cables.

As shown in FIGS. 1-4, the first sub-adapter 10 includes a first external adapter conductor 11 and a first center adapter conductor 12. A first end 11a of the first external adapter conductor 11 is adapted to electrically connect with a first end 111 of an external conductor 100 of the connector 1, and a second end 11b of the first external adapter conductor 11 is adapted to electrically connect with an external conductor of the first cable. The first center adapter conductor 12 is provided inside the first external adapter conductor 11. A first end 12a of the first center adapter conductor 12 is adapted to electrically connect with a first end 211 of a center conductor 200 of the connector 1, and a second end 12b of the first center adapter conductor 12 is adapted to electrically with an inner conductor of the first cable.

As shown in FIGS. 1-4, in an embodiment, the first end 11a of the first external adapter conductor 11 is threaded to the first end 111 of the external conductor 100 of the connector 1.

An external thread is formed on an outer wall of the first end 111 of the external conductor 100 of the connector 1, and an internal thread is formed on an inner wall of the first end 11a of the first external adapter conductor 11 and configured to mate with the external thread.

As shown in FIGS. 1-4, in an embodiment, the first end 12a of the first center adapter conductor 12 and the first end 211 of the center conductor 200 of the connector 1 are adapted to be connected together in a plug-in manner. The first end 12a of the first center adapter conductor 12 is tubular, the first end 211 of the center conductor 200 of the connector 1 is columnar, and the first end 211 of the center conductor 200 of the connector 1 is adapted to be inserted into the first end 12a of the first center adapter conductor 12.

The first adaptor 10, as shown in FIG. 4, has a first insulator 13 provided between the first external adapter conductor 11 and the first central adapter conductor 12, so as to hold the first central adapter conductor 12 in the first external adapter conductor 11.

As shown in FIGS. 1-2 and 5-6, in an embodiment, the second sub-adapter 20 includes a second external adapter conductor 21 and a second center adapter conductor 22. A first end 21a of the second external adapter conductor 21 is adapted to electrically connect with a second end 121 of the external conductor 100 of the connector 1, and the second end 21b of the second external adapter conductor 21 is adapted to electrically connect with an external conductor of the second cable. The second center adapter conductor 22 is provided inside the second external conductor 21. A first end 22a of second center adapter conductor 22 is adapted to electrically connect with a second end 221 of the center conductor 200 of the connector 1, and a second end 22b of second center adapter conductor 22 is adapted to electrically connect with an inner conductor of the second cable.

As shown in FIGS. 1-2 and 5-6, in an embodiment, a plurality of electrical contacts are formed on the second end 121 of the external conductor 100 of the connector 1. An end face of the first end 21a of the second external adapter conductor 21 is planar, and electrically contacts all of the plurality of electrical contacts on the second end 121 of the external conductor 100 of the connector 1.

As shown in FIGS. 1-2 and 5-6, in an embodiment, the first end 22a of the second center adapter conductor 22 is discoid, while the second end 221 of the center conductor 200 of the connector 1 is columnar. The end face of the first end 22a of the second center adapter conductor 22 is planar and electrically contacts the second end 221 of the center conductor 200 of the connector 1.

As shown in FIG. 6, in an embodiment, the second sub-adapter 20 has a second insulator 23 provided between the second external adapter conductor 21 and the second center adapter conductor 22, so as to hold the second center adapter conductor 22 in the second external adapter conductor 21.

As shown in FIGS. 1-4, in an embodiment, the external conductor 100 of the connector 1 has a first external conductor 110 and a second external conductor 120 which are slidably assembled together. The first external adapter conductor 11 of the first sub-adapter 10 electrically connects with the first external conductor 110 of the connector 1. The second external adapter conductor 21 of the second sub-adapter 20 electrically connects with the second external conductor 120 of the connector 1.

As shown in FIGS. 1-2 and 5-6, in an embodiment, the central conductor 200 of the connector 1 includes a first central conductor 210 and a second central conductor 220 which are slidably assembled together. The first center adapter conductor 12 of the first sub-adapter 10 electrically connects with the first center conductor 210 of the connector 1. The second center adapter conductor 22 of the second sub-adapter 20 electrically connects with the second center conductor 220 of the connector 1.

As shown in FIGS. 1-2, in an embodiment, the connector 1 includes an insulator 300 provided between the external conductor 100 and the center conductor 200, so as to hold the center conductor 200 in the external conductor 100. The connector 1 includes an insulating base 140, and the second external conductor 120 is fixed on the insulating base 140. A center through hole 141 is formed in the insulating base 140, and the second end 221 of the center conductor 100 of the connector 1 is exposed through the center through hole 141.

As shown in FIGS. 1-2, in an embodiment, the connector 1 includes an external elastic element 130, for example, a spring, which is sleeved on or fitted over the external conductor 100. A first end of the external elastic element 130 abuts against the insulating base 140, and a second end of the external elastic element 130 abuts against a positioning flange 112 of the first external conductor 110.

As shown in FIGS. 1-2, in an embodiment, the connector 1 includes an internal elastic element 230, for example, a spring, which is provided in the central conductor 200. A first end of the internal elastic element 230 abuts against the first central conductor 210, and a second end of the internal elastic element 230 abuts against the second central conductor 220.

As shown in FIGS. 1-6, in an embodiment, the first sub-adapter 10 is detachably connected with the first end of the connector 1, and the second sub-adapter 20 is detachably connected with the second end of the connector 1. As such, the connector 1 may be easily detached from the first sub-adapter 10 and the second sub-adapter 20, so that the connector 1 is capable of being reused.

In another exemplary embodiment of the present disclosure, there is also provided a connector test system. The connector test system comprises the first sub-adapter 10, the second sub-adapter 20, and a test equipment (not shown). One end of the first sub-adapter 10 is adapted to be electrically connected to a first end of a connector 1, and the other end of first sub-adapter 10 is electrically connected to a first cable (not shown). One end of the second sub-adapter 20 is adapted to be electrically connected to a second end of the connector 1, and the other end of the second sub-adapter 20 is electrically connected to a second cable (not shown). The test equipment is electrically connected to the first sub-adapter 10 and the second sub-adapter 20 via the first cable and the second cable, respectively.

In the various exemplary embodiments of the present disclosure, each end of the connector 1 may be directly connected to the adapter 10, 20, without being connected to the adapter 10, 20 through a circuit board. Therefore, it may effectively eliminate the influence of the circuit board on the test data of the connector 1, improve the accuracy of the test data of the connector 1, and reduce the cost.

It should be appreciated for those skilled in this art that the above embodiments are intended to be illustrative, and not restrictive. For example, many modifications may be made to the above embodiments by those skilled in this art, and various features described in different embodiments may be freely combined with each other without conflicting in configuration or principle. Although several exemplary embodiments have been shown and described, it would be appreciated by those skilled in the art that various changes or modifications may be made in these embodiments without departing from the principles and spirit of the disclosure, the scope of which is defined in the claims.

As used herein, an element recited in the singular and proceeded with the word "a" or "an" should be understood as not excluding plural of said elements or steps, unless such exclusion is explicitly stated. Furthermore, references to "one embodiment" of the present disclosure are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

What is claimed is:

1. A connector adapter, comprising:
a first sub-adapter directly and electrically connected with a first end of a connector, the first end of the connector is electrically connected to a first cable through the first sub-adapter and to a test equipment through the first cable, the first sub-adapter including:
a first external adapter conductor having a first end electrically connected with and threaded to a first end of an external conductor of the connector, a second end of the first external adapter conductor is formed integrally with, and fixed relative to, the first end of the first external adapter and adapted to be detachably electrically connected to an external conductor of the first cable; and
a first center adapter conductor fixedly arranged in the first external adapter conductor, the first center adapter conductor has a first end directly electrically connected with a first end of a center conductor of the connector and a second end fixedly connected to the first end and adapted to be detachably electrically connected to an inner conductor of the first cable; and
a second sub-adapter directly and electrically connected with a second end of the connector in an abutting manner without the use of threading, the second end of the connector is electrically connected to a second cable through the second sub-adapter and to the test equipment through the second cable, a plurality of electrical contacts are formed on a second end of the external conductor of the connector, a first end of a second external adapter conductor of the second sub-adapter has a planar end face abuttingly electrically contacting and positioned adjacent all of the plurality of electrical contacts on the second end of the external conductor of the connector, at least a portion of the plurality of electrical contacts of the connector protruding from the second end of the external conductor in a direction toward the first end of the second sub-adapter, the second external adapter conductor defines a radially-outward facing exterior surface of the second sub-adapter, the radially-outward facing exterior surface defining the outermost surface of the second sub-adapter in a radially-outward direction of the second sub-adapter, the external conductor of the connector includes:
a first external conductor defining the first end and threadably connected to the first external adapter conductor; and
a second external conductor defining the plurality of electrical contacts, at least a portion of the second external conductor protruding from the second end of the second external conductor, the second external adapter conductor having:
a first portion slidably received within the first external conductor of the external conductor of the connector and defining an exterior surface making sliding electrical contact with an interior surface of the first external conductor of the external conductor of the connector; and
a second portion extending radially outward from the first portion and defining the plurality of electrical contacts.

2. The connector adapter according to claim 1, wherein the connector is a coaxial RF connector, and the first cable and the second cable are coaxial RF cables.

3. The connector adapter according to claim 1, wherein an external thread is formed on an outer wall of the first end of the external conductor of the connector, and an internal thread is formed on an inner wall of the first end of the first external adapter conductor, the internal thread is matable with the external thread.

4. The connector adapter according to claim 1, wherein the first end of the first center adapter conductor and the first end of the center conductor of the connector are connected together in a plug-in manner.

5. The connector adapter according to claim 1, wherein the first end of the first center adapter conductor is tubular, the first end of the center conductor of the connector is columnar, the first end of the center conductor of the connector is insertable into the first end of the first center adapter conductor.

6. The connector adapter according to claim 1, wherein the first sub-adapter includes a first insulator provided between the first external adapter conductor and the first central adapter conductor, the first insulator holding the first central adapter conductor in the first external adapter conductor.

7. The connector adapter according to claim 1, wherein the second external adapter conductor has a second end adapted to be detachably electrically connected with an external conductor of the second cable, wherein the second sub-adapter includes a second center adapter conductor provided in the second external adapter conductor, the second center adapter conductor has a first end electrically connected with the second end of the center conductor of the connector and a second end fixed relative to the first end and adapted to be detachably electrically connected with an inner conductor of the second cable.

8. The connector adapter according to claim 7, wherein the first end of the second center adapter conductor is discoid, the second end of the center conductor of the connector is columnar, and the first end of the second center adapter conductor has a planar end face electrically contacting the second end of the center conductor of the connector.

9. The connector adapter according to claim 7, wherein the second sub-adapter includes a second insulator provided between the second external adapter conductor and the second center adapter conductor, the second insulator holding the second center adapter conductor in the second external adapter conductor.

10. The connector adapter according to claim 7, wherein the external conductor of the connector has a first external conductor and a second external conductor which are slidably assembled together, the first external adapter conductor of the first sub-adapter electrically connects with the first external conductor of the connector.

11. The connector adapter according to claim 10, wherein the central conductor of the connector includes a first central conductor and a second central conductor which are slidably assembled together, the first center adapter conductor of the first sub-adapter electrically connects with the first center conductor of the connector and the second center adapter conductor of the second sub-adapter electrically connects with the second center conductor of the connector.

12. The connector adapter according to claim 11, wherein the connector includes an insulator provided between the external conductor and the center conductor, the insulator holding the center conductor in the external conductor.

13. The connector adapter according to claim 11, wherein the connector includes an insulating base, the second external conductor is fixed on the insulating base and a center through hole is formed in the insulating base, the second end of the center conductor of the connector is exposed through the center through hole.

14. The connector adapter according to claim 13, wherein the connector includes an external elastic element sleeved over the first external conductor and the second external conductor so as to be arranged on a respective exterior surface of the first external conductor and the second external elastic conductor and exposed in a radial direction of the connector, a first end of the external elastic element abuts against the insulating base and a second end of the external elastic element abuts against a positioning flange of the first external conductor.

15. The connector adapter according to claim 13, wherein the connector includes an internal elastic element disposed in the central conductor, a first end of the internal elastic element abuts against the first central conductor and a second end of the internal elastic element abuts against the second central conductor.

16. The connector adapter according to claim 1, wherein the first sub-adapter is detachably connected with the first end of the connector and the second sub-adapter is detachably connected with the second end of the connector.

17. The connector adapter according to claim 1, wherein no portion of the connector extends to or beyond the plurality of electrical contacts on the second end of the connector in the direction of the first end of the second sub-adapter.

18. A connector test system, comprising:
a test equipment;
a connector having a first end and a second end;
a first sub-adapter having a first end directly and electrically connected with the first end of the connector via complementary threading, and a second end formed integrally with, and fixed relative to, the first end and electrically connected to a first cable, the first end of the connector is electrically connected to the first cable through the first sub-adapter and to the test equipment through the first cable; and
a second sub-adapter having a first end directly and electrically connected with the second end of the connector and a second end electrically connected to a second cable, the second end of the connector is electrically connected to the second cable through the second sub-adapter and to the test equipment through the second cable, the second sub-adapter including:
an external adapter conductor having:
a first end including a planar end face electrically connected with a plurality of electrical contacts formed on a second end of an external conductor of the connector, the second sub-adapter directly and electrically connected with the second end of the connector in an abutting manner without the use of a positively engaging coupling therebetween, at least a portion of the plurality of electrical contacts of the connector protruding from of the second end of the external conductor in a direction toward the first end of the second sub-adapter; and
a second end detachably electrically connected with an external conductor of the second cable; and
a center adapter conductor fixedly arranged in the external adapter conductor, the center adapter conductor has a first end directly electrically connected with a second end of a center conductor of the connector and a second end fixed relative to the first end of the center adapter conductor and detachably electrically connected with an inner conductor of the second cable, the first end of the center adapter conductor is discoid, the first end of the center conductor of the connector is columnar, and the first end of the center adapter conductor has a planar end face abuttingly electrically contacting and positioned adjacent the second end of the center conductor of the connector, the external adapter conductor defines a radially-outward facing exterior surface of the second sub-adapter, the radially-outward facing exterior surface defining the outermost surface of the second sub-adapter in a radially-outward direction of the second sub-adapter, the external conductor of the connector includes:
a first external conductor defining the first end and threadably connected to the first sub-adapter; and
a second external conductor defining the plurality of electrical contacts, at least a portion of the second external adapter conductor extending at a second end of the connector, the second external conductor of the external conductor of the connector having:
a first portion slidably received within the first external conductor of the external conductor of the connector and defining an exterior surface making sliding electrical contact with an interior surface of the first external conductor of the external conductor of the connector; and
a second portion extending radially outward from the first portion and defining the plurality of electrical contacts.

19. A connector system, comprising:
a connector, including:
an external conductor having a first end and a second end, the first end elastically movable relative to the second end in the axial direction of the connector, the second end defining a plurality of electrical contacts protruding from a second end of the connector; and
an internal center conductor having a first end and a second end, the first end elastically movable relative to the second end in an axial direction of the connector; a first sub-adapter, including:
a first external adapter conductor threadably connected on a first end thereof to the first end of the external conductor of the connector, the first external adapter conductor having a second end formed integrally with, and fixed relative to, the first end of the first external adapter and adapted to be detachably electrically connected to an external conductor of a cable; and
a first internal adapter conductor having first and second fixed ends and directly electrically connected to the first end of the internal center conductor of the connector; and
a second sub-adapter, including:

a second external adapter conductor abuttingly connected to the second end of the external conductor of the connector; and a second internal adapter conductor having first and second fixed ends and abuttingly connected and positioned adjacent to the second end of the internal center conductor of the connector, wherein the external conductor of the connector includes:

a first external conductor defining the first end and threadably connected to the first external adapter conductor; and a second external conductor defining the plurality of electrical contacts, at least a portion of the second external conductor protruding at the second end of the connector, the second external conductor of the external conductor of the connector having:

a first portion slidably received within the first external conductor of the external conductor of the connector and defining an exterior surface making sliding electrical contact with an interior surface of the first external conductor of the external conductor of the connector; and a second portion extending radially outward from the first portion and defining the plurality of electrical contacts.

20. The connector system of claim 19, wherein the second external adapter conductor defines a radially-outward facing exterior surface of the second external adapter, the radially-outward facing exterior surface defining the outermost surface of the second external adapter in a radially-outward direction of the second sub-adapter.

* * * * *